United States Patent
Takahashi et al.

(10) Patent No.: US 8,054,605 B2
(45) Date of Patent: *Nov. 8, 2011

(54) POWER SUPPLY CONTROLLER

(75) Inventors: Seiji Takahashi, Yokkaichi (JP);
Masayuki Kato, Yokkaichi (JP);
Masahiko Furuichi, Yokkaichi (JP);
Isao Isshiki, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 386 days.

This patent is subject to a terminal disclaimer.

(21) Appl. No.: 12/223,652

(22) PCT Filed: Feb. 20, 2007

(86) PCT No.: PCT/JP2007/053035
§ 371 (c)(1),
(2), (4) Date: Aug. 6, 2008

(87) PCT Pub. No.: WO2007/097300
PCT Pub. Date: Aug. 30, 2007

(65) Prior Publication Data
US 2009/0052096 A1    Feb. 26, 2009

(30) Foreign Application Priority Data

Feb. 22, 2006  (JP) ................. 2006-045701

(51) Int. Cl.
*H02H 3/00* (2006.01)

(52) U.S. Cl. ............... 361/96; 361/94; 361/97; 361/98
(58) Field of Classification Search ............ 361/93.1, 361/96, 97, 98, 100, 101, 94
See application file for complete search history.

(56) References Cited

U.S. PATENT DOCUMENTS

| | | | |
|---|---|---|---|
| 6,424,131 B1 | 7/2002 | Yamamoto et al. | |
| 6,853,566 B2* | 2/2005 | Itoh | 363/60 |
| 7,652,863 B2* | 1/2010 | Ito et al. | 361/93.1 |
| 7,701,686 B2* | 4/2010 | Kato et al. | 361/93.1 |
| 2004/0252434 A1* | 12/2004 | Mori et al. | 361/93.1 |
| 2007/0146951 A1* | 6/2007 | Takahashi et al. | 361/93.1 |

FOREIGN PATENT DOCUMENTS

CN    1159846 C    7/2004
(Continued)

OTHER PUBLICATIONS

Chinese Office Action issued on Jun. 3, 2010 in Chinese Patent Application No. 200780006291.3 (with translation).

(Continued)

*Primary Examiner* — Patrick Salce
(74) *Attorney, Agent, or Firm* — Oliff & Berridge, PLC

(57) ABSTRACT

A gate driver 28 performs a normal charging operation for a power MOSFET 14 by driving a charge pump 90 solely, when a low-level control signal S1 (ON signal) is received during a normal state. On the other hand, if a low-level control signal S1 (ON signal) is received during a load anomaly state, an urgent charge FET 92, as well as the charge pump 90, is turned on when a load current IL exceeds a second anomaly threshold current ILfc, so that a rapid charging operation is performed.

9 Claims, 10 Drawing Sheets

FOREIGN PATENT DOCUMENTS

| | | |
|---|---|---|
| DE | 41 06 690 A1 | 9/1992 |
| DE | 10 2006 061 183 A1 | 7/2007 |
| EP | 1 115 203 A1 | 7/2001 |
| JP | A-07-066700 | 3/1995 |
| JP | A-2001-217696 | 8/2001 |
| JP | A-2002-353794 | 12/2002 |
| JP | A-2004-235939 | 8/2004 |
| WO | WO 00/79682 A1 | 12/2000 |
| WO | WO 02/097940 A2 | 12/2002 |

OTHER PUBLICATIONS

Aug. 31, 2010 Office Action issued in German Application No. 11 2007 000 411.8-31 (with Translation).

* cited by examiner

POWER SUPPLY CONTROLLER

TECHNICAL FIELD

The present invention relates to a power supply controller.

BACKGROUND ART

A power supply controller used as a so-called high-side driver is conventionally provided, in which an N-channel MOSFET for current control is disposed between a positive power source and a load as shown in JP-A-2001-217696. In the power supply controller, the gate voltage should be higher than (or generally about double) the power supply voltage in order that the MOSFET is adequately turned ON (i.e., turned to a conductive state). For achieving this, a gate driver circuit (or a charge pump circuit) should be provided. Specifically, when an ON signal is externally inputted to the power supply controller, the gate driver circuit generates a higher voltage as an output voltage from an input voltage that is based on the power supply voltage, and applies the output voltage to the gate so as to turn ON the MOSFET. Some of such power supply controllers have an overcurrent protective function for forcibly turning OFF the MOSFET in response to a current anomaly wherein a load current passing through the MOSFET exceeds a predetermined threshold due to a load anomaly such as short-circuiting of the load.

In the case that the MOSFET is turned ON due to an ON signal applied when a load anomaly has occurred as described above, it is desirable to turn the MOSFET to a shutoff state early. For achieving this, the charge rate of the gate driver circuit should be as high as possible so that the load current exceeds the above threshold early. However, if the charge rate of the gate driver circuit as a constant rate is set to be high in the conventional power supply controller, the MOSFET is charged rapidly even when it is turned ON during a normal state in which a load anomaly has not occurred. This will result in noise generation due to precipitous change of the load current. Conversely, if the charge rate of the charging circuit is set to be lower, noise generation can be suppressed. However, the problem arises that the MOSFET will be slow to turn OFF after the MOSFET is turned ON during a load anomaly, which will result in great power loss (or switching loss).

Thus, there is a need in the art for a power supply controller enabling reduction of power loss during a load anomaly while suppressing noise generation.

SUMMARY OF THE INVENTION

A power supply controller according to the present invention includes a MOSFET disposed between a power source and a load; a current detecting element configured to output a current detection signal corresponding to a load current passing through the MOSFET; and an overcurrent protective circuit configured to perform a forcing shutoff operation for the MOSFET, if a first current anomaly, in which a load current passing through the MOSFET exceeds a first threshold, is determined based on the current detection signal. Further included is a charging circuit configured to turn on the MOSFET based on an external ON signal by applying a charging current to the gate of the MOSFET. The charging circuit is capable of changing a charge rate thereof The power supply controller further includes a control circuit that performs control for causing the charging circuit to increase the charge rate thereof if a second current anomaly, in which a load current passing through the MOSFET exceeds a second threshold lower than the first threshold, is determined based on the current detection signal, so that the charge rate is higher than that when the load current is equal to or lower than the second threshold.

According to the present invention, the charging circuit is controlled so as to change its charge rate to be higher if the load current exceeds the second threshold (lower than the first threshold for performing a forcing shutoff operation for the MOSFET) during a charging operation due to an occurrence of a load anomaly such as short-circuiting of the load. Therefore, when the load current is equal to or lower than the second threshold because a load anomaly has not occurred, a conductive operation for the MOSFET is performed at a relatively low charging rate (i.e., charging for the gate is performed at a rate of a smaller charge amount per unit time). Thereby, noise generation can be suppressed. If a load anomaly, leading to the load current exceeding the first threshold, has occurred, the charge rate is changed to be higher when the load current exceeds the second threshold, so that the load current can reach the first threshold early. Thereby a forcing shutoff operation can be performed for the MOSFET rapidly.

BEST MODE FOR CARRYING OUT THE INVENTION

An embodiment of the present invention will be explained with reference to FIGS. 1 through 5A and B.

1. Construction of Power Supply Controller (1) General Construction

Figure 1:
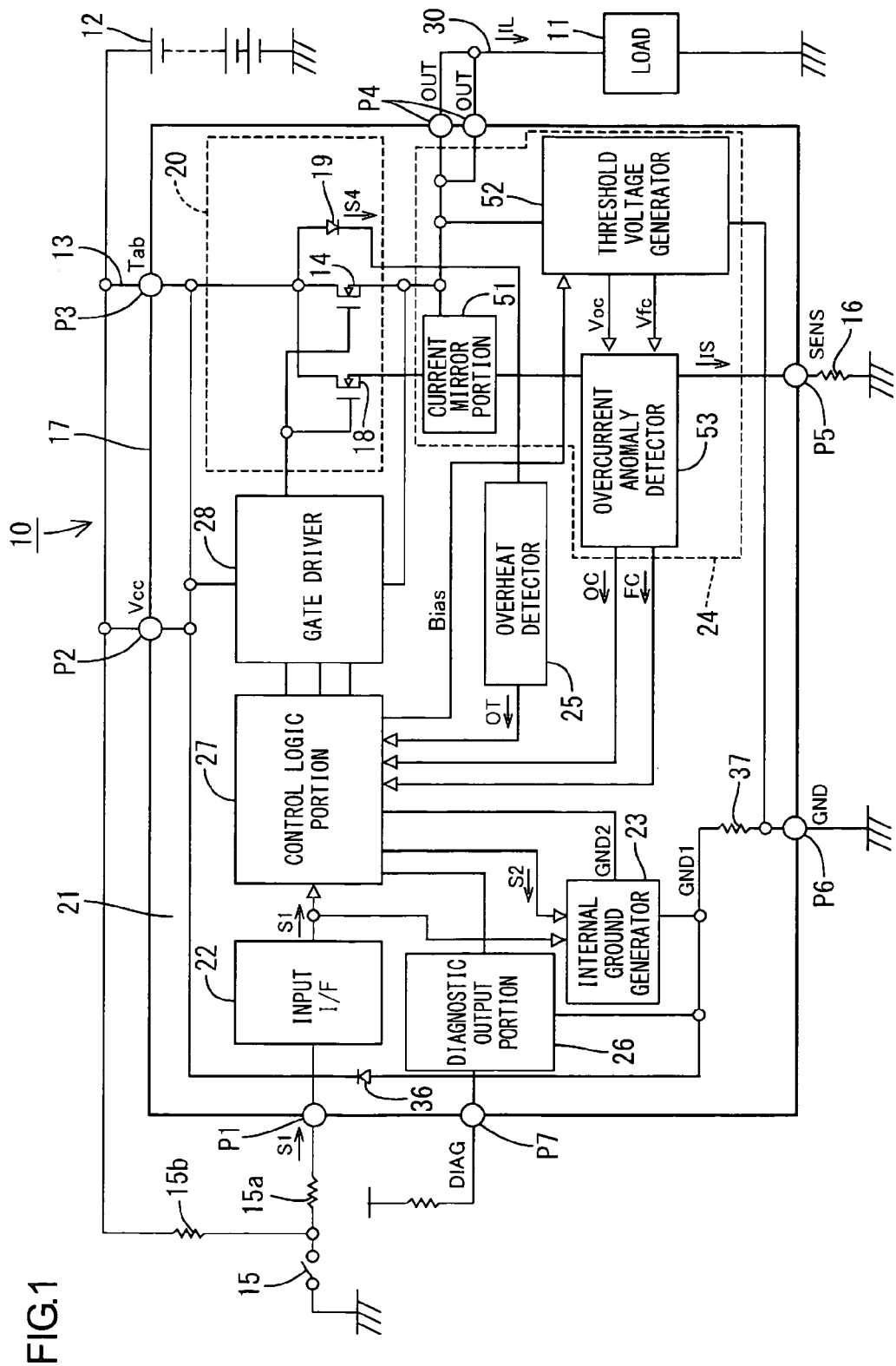
[FIG. 1] is a block diagram showing the general construction of a power supply controller according to an embodiment of the present invention.

FIG. 1 is a block diagram showing the general construction of a power supply controller 10 according to the present embodiment. The power supply controller 10 can be installed on a vehicle not shown, and used for control of power supply from a vehicle power source (hereinafter, referred to as "a power source 12") to a load 11 such as a vehicle lamp, a cooling fan motor or a defogger heater. Hereinafter, "a load" means a device to be controlled by the power supply controller 10, and does not include an electric wire 30 connected between the power supply controller 10 and the controlled device. The load 11 and the electric wire 30 are collectively called "an external circuit" in the following explanation.

Specifically, the power supply controller 10 includes an N-channel power MOSFET 14 (i.e., an example of "a MOSFET") disposed on a current supply line 13 connected between the power source 12 and the load 11. In the power supply controller 10, a control signal S1 such as a constant voltage signal or a PWM (Pulse Width Modulation) control signal is applied to the gate of the power MOSFET 14 so as to switch the power MOSFET between ON and OFF. Thereby, power supply to the load 11 connected to the output side of the power MOSFET 14 is controlled. In the present embodiment, an input terminal P1 of the power supply controller is connected to an external operation switch 15, and the power supply controller 10 operates when the operation switch 15 is ON. Specifically, the input terminal P1 is connected to the operation switch 15 via a resistor 15a, and the connecting point between the operation switch 15 and the resistor 15a is connected to the power source 12 via a resistor 15b. Thus the input terminal P1 is pulled up to the power supply voltage Vcc side when the operation switch 15 is OFF.

As shown in FIG. 1, the power supply controller 10 is formed as a semiconductor device 17 (semiconducting device), on which the input terminal P1, a power supply (Vcc) terminal P2 and a tab terminal P3 to be connected to the power source 12, a load connecting terminal P4 to be connected to the load 11, an external terminal P5 to be connected to the ground (GND) via an external resistor 16 as an example of a current-voltage converter circuit, a ground terminal P6 to be connected directly to the ground (GND), and a diagnostic output terminal P7 are provided. In the present embodiment, the power MOSFET 14, a sense MOSFET 18 (i.e., an example of "a current detecting element") described below and a temperature sensor 19 (e.g., a diode in the present embodiment) as an example of a temperature detecting element are configured onto a single chip as a power chip 20, which is mounted on a control chip 21 that includes the other circuits.

A plurality of MOSFETs are arranged on the power chip 20. The drains of the MOSFETs are connected in common to the tab terminal P3. The sources of most of the MOSFETs are connected in common to a power FET input 51a of a current mirror portion 51 described below and the load connecting terminal P4, so that the MOSFETs form the power MOSFET 14. The sources of the rest of the MOSFETs are connected in common to a sense FET input 51b of the current mirror portion 51, so that the MOSFETs form the sense MOSFET 18. The ratio of the number of MOSFETs constituting the sense MOSFET 18 to the number of MOSFETs constituting the power MOSFET 14 corresponds approximately to a sense ratio.

The control chip 21 mainly includes an input interface 22, an internal ground generator 23, a current detector 24, an overheat detector 25, a diagnostic output portion 26, a control logic portion 27 functioning as an overcurrent protective circuit and as an overheat protective circuit, and a gate driver 28.

2. Construction of Each Component (1) Input Interface

The input side of the input interface 22 is connected to the input terminal P1. Thereby a control signal S1 of high level is inputted when the operation switch 15 is OFF, while a control signal S1 of low level is inputted when the operation switch is ON. The control signal S1 is then applied to the internal ground generator 23 and the control logic portion 27. In a normal state, i.e., when neither a current anomaly nor a temperature anomaly has occurred as will be described below, the power supply controller 10 turns ON the power MOSFET 14, resulting in a conductive state, by the gate driver 28 in response to a low-level control signal S1 described above. On the other hand, in response to a high-level control signal S1, the power supply controller 10 turns OFF the power MOSFET 14 by the gate driver 28, resulting in a shutoff state. A low-level control signal S1 of the present embodiment is an example of "an ON signal". A high-level control signal S1 is an example of "an OFF signal".

As shown in FIG. 1, a diode 36, the cathode side of which is connected to the higher potential side, and a resistor 37 are serially connected between the power supply terminal P2 and the ground terminal P6. The connecting point there between is provided as the internal ground GND1. According to this construction, if the ground terminal P6 side is connected to the power supply voltage Vcc side by mistake, a current passing into the circuits of the power supply controller 10 is suppressed because of the diode 36 so as to be equal to or lower than a predetermined level.

(2) Internal Ground Generator

The internal ground generator 23 as an example of a constant supply-voltage generator operates when it receives a low-level control signal S1 (ON signal) from the input interface 22, so as to generate an internal ground GND2 lower than the power supply voltage Vcc by a predetermined voltage. Thus the constant voltage, corresponding to the difference determined by subtracting the internal ground GND2 from the power supply voltage Vcc, is provided for the control logic portion 27, and thereby the control logic portion 27 can operate.

(3) Current Detector

Figure 2:
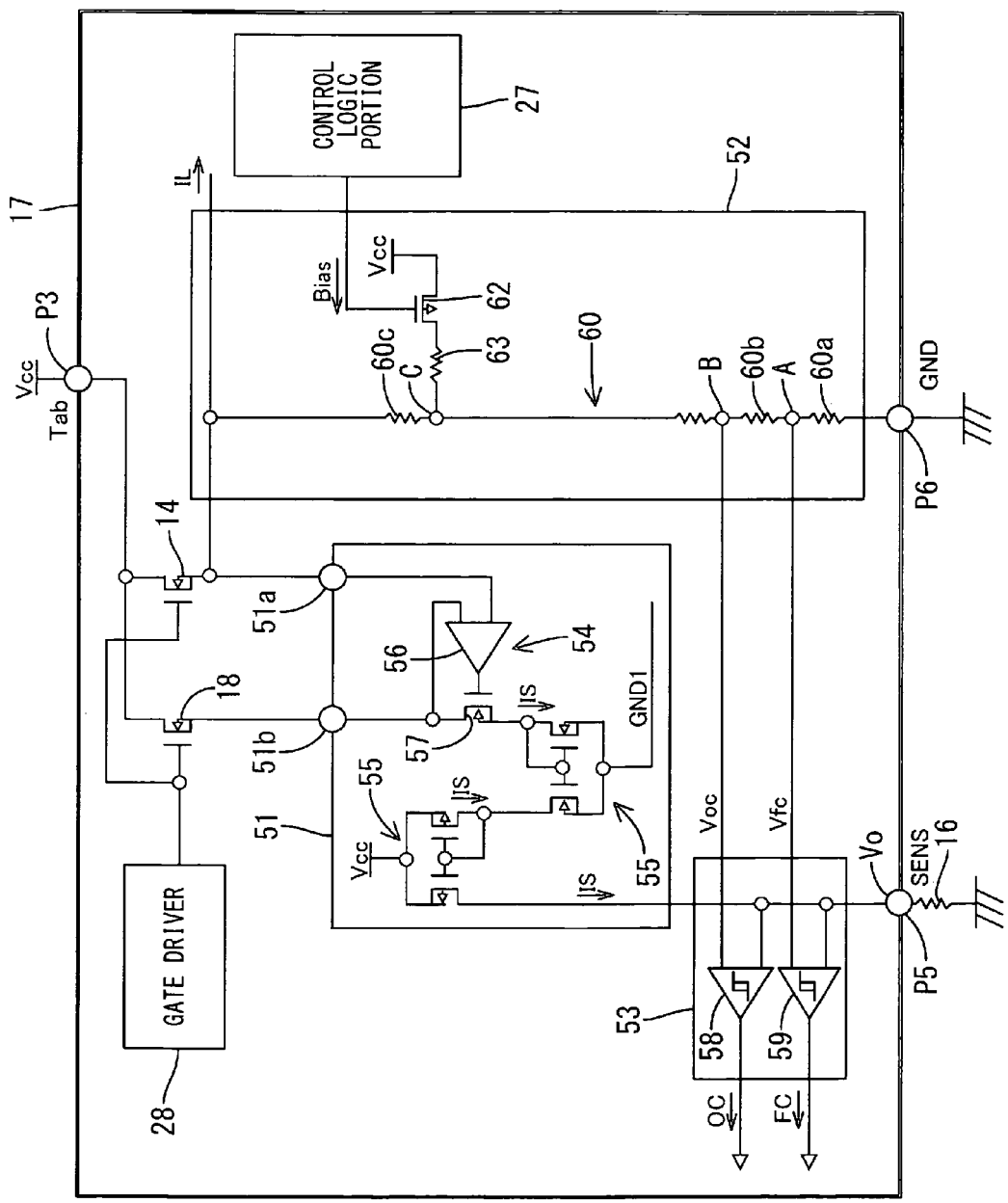
[FIG. 2] is a circuit diagram showing a current mirror portion, a threshold voltage generator and an overcurrent anomaly detector.

The current detector 24 includes a current mirror portion 51, a threshold voltage generator 52, and an overcurrent anomaly detector 53 as shown in FIG. 1. FIG. 2 magnifies and shows the circuits of the current mirror portion 51, the threshold voltage generator 52 and the overcurrent anomaly detector 53, and the rest of the circuit construction is partly omitted.

a. Current Mirror Portion

The current mirror portion 51 includes a potential controller 54 for maintaining the output-side potentials (i.e., the source potentials) of the power MOSFET 14 and the sense MOSFET 18 to be equal to each other, and further includes a pair of current mirror circuits 55 and 55.

The potential controller 54 includes an operational amplifier 56 and an FET 57 as a switching element. The pair of input terminals of the operational amplifier 56 are connected to the power FET input 51a (i.e., to the source of the power MOSFET 14) and the sense FET input 51b (i.e., to the source of the sense MOSFET 18), respectively. The FET 57 is connected between the sense FET input 51b and the external terminal P5, and the output of the operational amplifier 56 is applied to the control terminal thereof. More specifically, the negative input of the operational amplifier 56 is connected to the power FET input 51a, while the positive input of the operational amplifier 56 is connected to the sense FET input 51b. The differential output of the operational amplifier 56 is fed back to the positive input through between the gate and drain of the FET 57.

The operational amplifier 56 is maintained in an imaginary short state due to the feedback of the differential output of the operational amplifier 56, that is, the potentials of the positive input and negative input are maintained almost equal to each other. Thereby the potentials of the drains of the power MOSFET 14 and the sense MOSFET 18 are maintained equal to each other, and the potentials of the sources thereof are also maintained equal to each other. Consequently, a sense current Is (corresponding to "a current detection signal from a current detecting element") passing through the sense MOSFET 18 can be stably maintained to a constant ratio (i.e., the above sense ratio) to a load current IL passing through the power MOSFET 14.

The sense current Is from the potential controller 54 passes into the external resistor 16 via the pair of current mirror circuits 55, 55 and the external terminal P5, and therefore the terminal voltage Vo of the external terminal P5 varies with the sense current Is.

b. Overcurrent Anomaly Detector

The overcurrent anomaly detector 53 includes a plurality (e.g., two in the present embodiment) of comparators 58, 59 (e.g., hysteresis comparators in the present embodiment). The terminal voltage Vo of the external terminal P5 is applied to one input of the comparator 58 and one input of the comparator 59.

The comparator 58 receives a first anomaly threshold voltage Voc on the other input thereof from the threshold voltage generator 52, and outputs a first abnormal current signal OC of low level to the control logic portion 27 when the terminal voltage Vo exceeds the first anomaly threshold voltage Voc. Hereinafter, a load current IL, passing through the power MOSFET 14 when the terminal voltage Vo reaches the first anomaly threshold voltage Voc, i.e., during a current anomaly, is called "a first anomaly threshold current ILoc" (i.e., an example of "a first threshold"), and this current anomaly is called "an overcurrent" (i.e., an example of "a first current anomaly").

The comparator 59 receives a second anomaly threshold voltage Vfc (<Voc) on the other input thereof from the threshold voltage generator 52, and outputs a second abnormal current signal FC of low level to the control logic portion 27 when the terminal voltage Vo exceeds the second anomaly threshold voltage Vfc. Hereinafter, a load current IL, passing through the power MOSFET 14 when the terminal voltage Vo reaches the second anomaly threshold voltage Vfc, i.e., during a current anomaly, is called "a second anomaly threshold current ILfc" (i.e., an example of "a second threshold"), and this current anomaly is called "a fuse current" (i.e., an example of "a second current anomaly").

c. Threshold Voltage Generator

The threshold voltage generator 52 includes a voltage-dividing circuit for dividing a reference voltage by a plurality of resistors, and outputs, as the first anomaly threshold voltage Voc and the second anomaly threshold voltage Vfc, a plurality of divided voltages generated by the voltage-dividing circuit. Specifically, as shown in FIG. 2, the threshold voltage generator 52 includes a voltage-dividing circuit 60 connected between the source of the power MOSFET 14 and the ground terminal P6. The voltage-dividing circuit 60 is formed by serially connecting a plurality of resistors (e.g., three resistors 60a-60c in the present embodiment). The divided voltage at the connecting point A between the resistors 60a and 60b is outputted as the second anomaly threshold voltage Vfc, while the divided voltage at the connecting point B between the resistors 60b and 60c is outputted as the first anomaly threshold voltage Voc.

In the present embodiment, the voltage-dividing circuit 60 is configured to divide the source voltage Vs of the power MOSFET 14, but may be configured to divide a predetermined voltage other than the source voltage. According to the construction of the present embodiment, the anomaly threshold voltages Voc, Vfc can be set so as to vary with the source voltage Vs of the power MOSFET 14. Compared with a construction wherein the thresholds are set to fixed levels irrespective of variation of the source voltage, the terminal voltage Vo of the external resistor 16 immediately reaches the anomaly threshold voltage Voc or Vfc irrespective of the magnitude of the power supply voltage Vcc, when short-circuiting in the load 11 or the like has occurred, for example. Thereby the current anomaly can be detected rapidly.

Moreover in the present embodiment, in order that the source voltage Vs is biased so as not to be 0[V] when the power MOSFET 14 is OFF, an FET 62, which is an example of a switching element that turns on in response to a bias signal Bias from the control logic portion 27, is provided, through which a current from the power source 12 passes into the voltage-dividing circuit 60 via a resistor 63. The bias signal Bias is outputted from the control logic portion 27 for turning on the FET 62, when a control signal S1 of low level is inputted.

Figure 3:
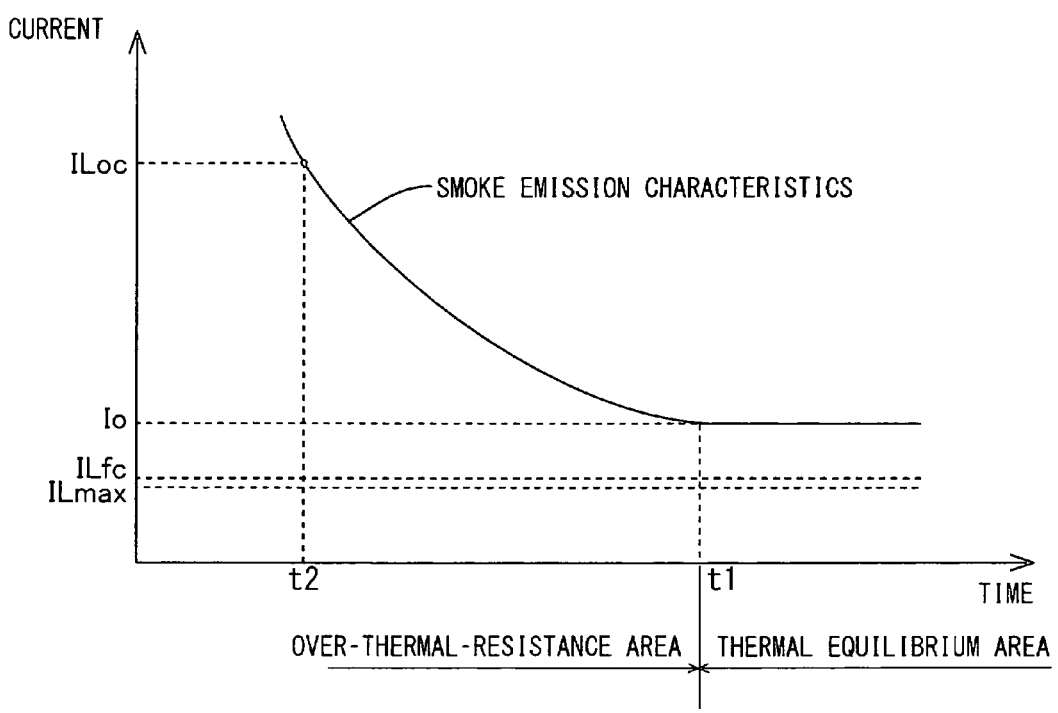
[FIG. 3] is a graph for explanation of setup levels of a first anomaly threshold current and a second anomaly threshold current.

FIG. 3 is a graph showing the smoke emission characteristics of an external circuit such as an electric wire 30 (e.g., a coating material of the electric wire) connectable to the power supply controller 10, in which the relation between a current level and a current-applying time (i.e., a time taken for fusing) is shown. That is, what is shown is the relation between an arbitrary constant current (one-shot current) and a time taken for the coating material of the electric wire 30 to begin to burn while the constant current is applied to the electric wire 30. Note that the smoke emission characteristics shown in the graph relates to an electric wire 30 to be connected to the power supply controller 10. The smoke emission characteristics depends on an external circuit (e.g., a wiring member such as an electric wire, or a load) to be connected to the power supply controller 10. Therefore the levels of the sense current Is, based on which the above anomaly signals FC, OC are outputted, should be also changed depending thereon. However, that can be readily achieved by adjusting the resistance of the above-described external resistor 16.

In the graph, ILmax represents the rated current of the load 11 (i.e., a limit of use against which the design thereof is guaranteed). Io represents the equilibrium critical current that can be applied while maintaining a thermal equilibrium state in which heat generation and radiation in the electric wire 30 are balanced. If a current of a higher level than the equilibrium critical current Io is applied, that relates to the over-thermal-resistance area in which a current level and a time taken for burn are substantially in inverse proportion to each other. The second anomaly threshold current ILfc is set to a value slightly higher than the rated current ILmax of the load 11. If the load current IL is around this level, the power MOSFET 14 does not need to be turned OFF immediately. It should be turned OFF, only if the fuse current state continues for a considerable time as described below.

In contrast, the first anomaly threshold current ILoc is set to a value higher than the second anomaly threshold current ILfc. When the load current IL reaches this high level, the power MOSFET 14 should be turned OFF immediately as described below.

(4) Overheat Detector

The overheat detector 25 receives a temperature signal S4 corresponding to a temperature of the power chip 20 from the temperature sensor 19 provided on the power chip 20. The overheat detector 25 detects a temperature anomaly when the received temperature signal S4 indicates an abnormal temperature exceeding a predetermined threshold temperature, and provides a low-level abnormal temperature signal OT to the control logic portion 27.

During a first or second forcing shutoff operation being performed for the power MOSFET 14 by the control logic portion 27 in response to an occurrence of a current anomaly or a temperature anomaly as described below, the diagnostic output portion 26 provides a diagnostic output by pulling down the diagnostic output terminal P7 to a low level in response to a high-level diagnostic signal Diag from the control logic portion 27. Thereby notification of the forcing shutoff state of the power MOSFET 14 due to the occurrence of a current anomaly or a temperature anomaly or due to the fuse function being performed can be provided to the outside.

(5) Control Logic Portion

The control logic portion 27 receives the control signal S1 from the input interface 22, the first and second abnormal current signals OC, FC from the current detector 24, and the abnormal temperature signal OT from the overheat detector 25 as described above. The control logic portion provides the control signal S1 and the second abnormal current signal FC directly to the gate driver 28. Further, if at least one of a low-level first abnormal current signal OC from the current detector 24 and a low-level abnormal temperature signal OT from the overheat detector 25 is received, the control logic portion 27 forcibly performs a shutoff operation for the power MOSFET 14 for a predetermined reference shutoff duration, and there after releases the forcing shutoff state. Hereinafter, this forcing shutoff (operation) is referred to as "first forcing shutoff (operation)". In the present embodiment, "forcing shutoff" means that the power MOSFET 14 is turned OFF although the power supply controller 10 is receiving a low-level control signal S1 (ON signal).

Specifically, when at least one of a low-level first abnormal current signal OC and a low-level abnormal temperature signal OT is received, the control logic portion 27 provides an output signal Inhibit of low level for the gate driver 28, so that a first forcing shutoff operation described above is performed for the power MOSFET 14. When the predetermined reference shutoff duration has elapsed, the control logic portion provides an output signal Inhibit of high level for the gate driver 28, so as to release the forcing shutoff state of the power MOSFET 14. Thus the current detector 24 and the control logic portion 27 function as an example of "an overcurrent protective circuit" of the present invention.

Further, the control logic portion 27 accumulates an anomaly time (hereinafter, referred to as "a FUSE time") during which a second abnormal current signal FC of low level is received from the current detector 24 or first forcing shutoff is performed. If the accumulated time reaches a predetermined reference FUSE time (which is longer than the reference shutoff duration), the control logic portion also provides an output signal Inhibit of low level for the gate driver 28, so that a forcing shutoff operation is performed for the power MOSFET 14. Hereinafter, this forcing shutoff (operation) is referred to as "second shutoff (operation)". The second forcing shutoff state can be released, if a high-level control signal S1 (OFF signal) is continuously inputted to the input terminal P1 of the power supply controller 10 for a predetermined time, for example.

(6) Gate Driver

Figure 4:
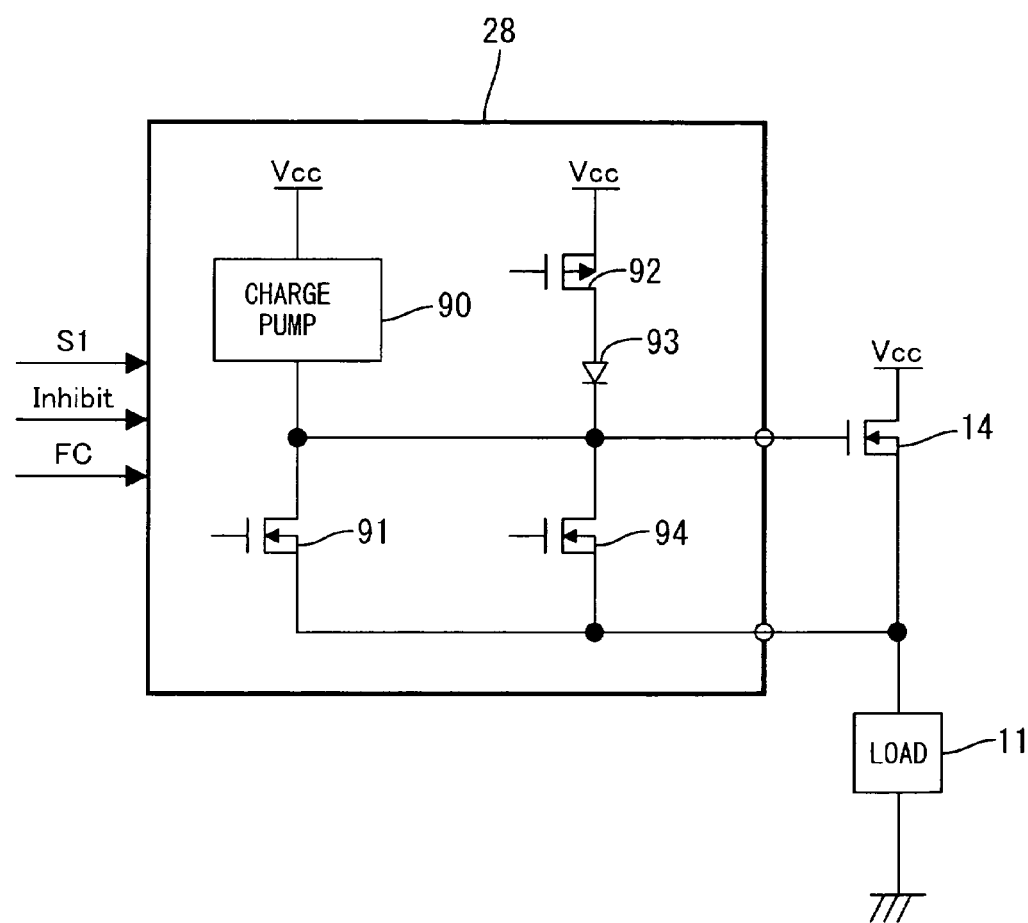
[FIG. 4] is a schematic diagram showing the construction of a gate driver.
Figure 5A:
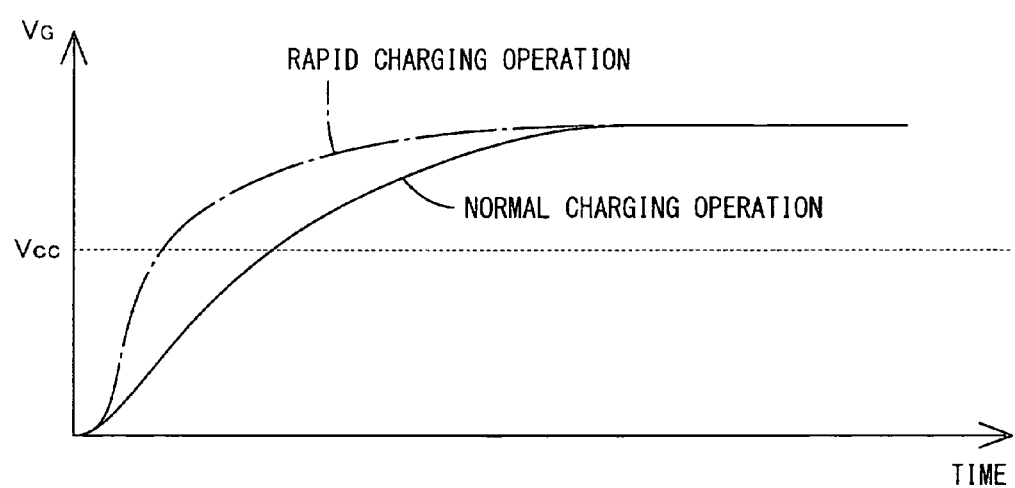
[FIG. 5A] is a graph showing the relation between the gate voltage and charging time.
Figure 5B:
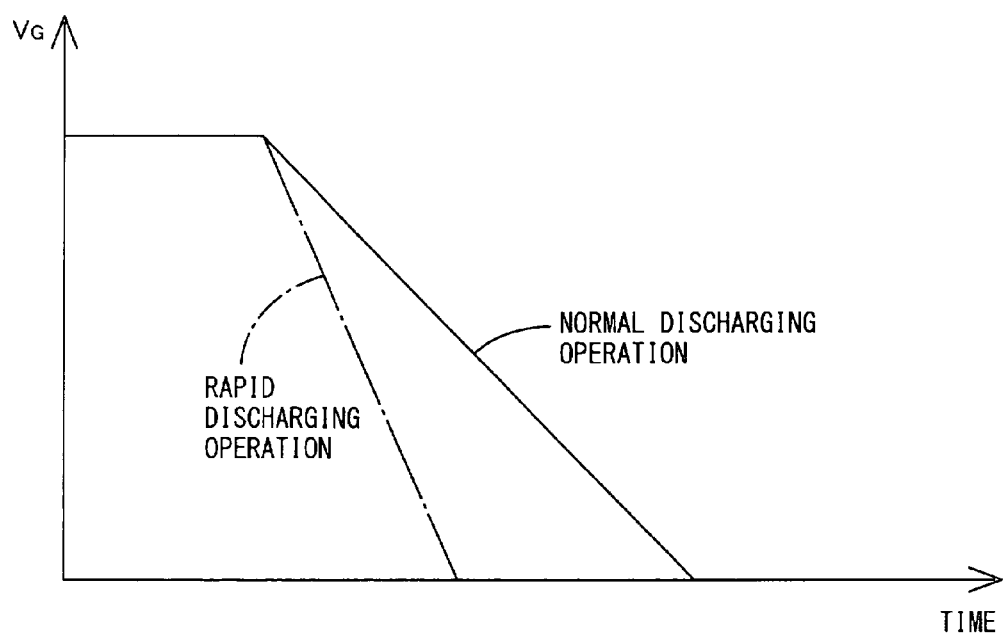
[FIG. 5B] is a graph showing the relation between the gate voltage and discharging time.

FIG. 4 is a schematic diagram showing the construction of the gate driver 28. To the gate driver 28, the control signal S1, the second abnormal current signal FC and the output signal Inhibit are inputted from the control logic portion 27. The gate driver 28 includes a charge pump 90 (i.e., an example of "a first charger") connected between the power supply terminal P2 and the gates of the power MOSFET 14 and sense MOSFET 18 (omitted from the figure), and further includes a normal discharge FET 91 (i.e., an example of "a discharge switching element") connected between the gates and sources of the power MOSFET 14 and sense MOSFET 18.

Moreover, the gate driver 28 includes an urgent charge FET 92 (i.e., an example of "a charge switching element") and a diode 93 (i.e., an example of "a second charger"), which are connected between the power supply terminal P2 and the gates of the power MOSFET 14 and sense MOSFET 18. Further included is an urgent discharge FET 94 (i.e., an example of "a discharge switching element") connected between the gates and sources of the power MOSFET 14 and the sense MOSFET 18. The charge pump 90, the urgent charge FET 92 and the diode 93 correspond to an example of "a charging circuit". The normal discharge FET 91 and the urgent discharge FET 94 correspond to an example of "a discharging circuit".

In a normal state wherein a load anomaly such as short-circuiting of the load has not occurred, the gate driver 28 drives the charge pump 90 solely in response to a low-level control signal S1 (ON signal) so as to apply a higher voltage, generated from the power supply voltage Vcc, to between the gate and source of each of the power MOSFET 14 and the sense MOSFET 18. Thus, a normal charging operation is performed (See the solid-line graph in FIG. 5A) for turning ON the power MOSFET and the sense MOSFET, resulting in a conductive state. On the other hand, in response to a high-level control signal S1 (OFF signal), the gate driver stops the charge pump 90 generating a higher voltage while turning on the normal discharge FET 91 solely, so that the charge between the gate and source of each of the power MOSFET 14 and the sense MOSFET 18 is released. Thus, a normal discharging operation or a shutoff operation is performed (See the solid-line graph in FIG. 5B).

In contrast, if a low-level control signal S1 (ON signal) is received during an occurrence of a load anomaly, for example, the charge pump 90 initially operates solely so as to begin a charging operation for the power MOSFET 14. When the load current IL exceeds the second anomaly threshold current ILfc, the gate driver 28 turns on the urgent charge FET 92 as well as the charge pump 90 in response to a second abnormal current signal FC, so that the voltage rapidly rises to the power supply voltage Vcc. Thus a rapid charging operation is performed (See the chain-line graph in FIG. 5A). In the case that a first forcing shutoff state is released during reception of a low-level control signal S1 (ON signal) when a predetermined reference shutoff duration has elapsed since the first forcing shutoff operation is initiated, a rapid charging operation is also performed if the load anomaly has not been eliminated.

When a high-level control signal S1 (OFF signal) is received during reception of a second abnormal current signal FC of low level, the urgent discharge FET 94 as well as the normal discharge FET 91 is turned on so that the charge between the gate and source of each of the power MOSFET 14 and the sense MOSFET 18 is released rapidly. Thus a rapid discharging operation is performed (See the chain-line graph in FIG. 5B), so that the power MOSFET and the sense MOSFET are shut off. When the first or second forcing shutoff operation is initiated, a rapid discharging operation is performed. The control logic portion 27 functions as an example of "a control circuit".

3. Effects of the Present Embodiment

As described above, according to the present embodiment, the gate driver 28 performs a normal charging operation for the power MOSFET 14 by driving the charge pump 90 solely, when a low-level control signal S1 (ON signal) is received during a normal state. Thereby noise generation can be suppressed. On the other hand, if a low-level control signal S1

(ON signal) is received during a load anomaly state, the urgent charge FET 92 as well as the charge pump 90 is turned on when the load current IL exceeds the second anomaly threshold current ILfc, so that a rapid charging operation is performed. Thereby the load current IL can reach the first anomaly threshold current ILoc early, that is, a first forcing shutoff operation for the MOSFET can be initiated rapidly.

If a high-level control signal S1 (OFF signal) is received during a normal state, the gate driver 28 performs a normal discharging operation by turning on the normal discharge FET 91 solely. Thereby noise generation can be suppressed. On the other hand, if a high-level control signal S1 (OFF signal) is received during a load anomaly state, the urgent discharge FET 94 as well as the normal discharge FET 91 is turned on, so that a rapid discharging operation is performed. The first or second forcing shutoff operation can be initiated rapidly by performing a rapid discharging operation, resulting in reduction of power loss.

According to the present embodiment, a second discharge path parallel to the conventional charge pump 90 is provided, and the charge rate can be changed by switching the urgent charge FET 92, provided on the second discharge path, between on and off. Thus noise reduction can be achieved by a relatively simple construction, compared to other constructions described below.

Another Embodiment

Figure 6:
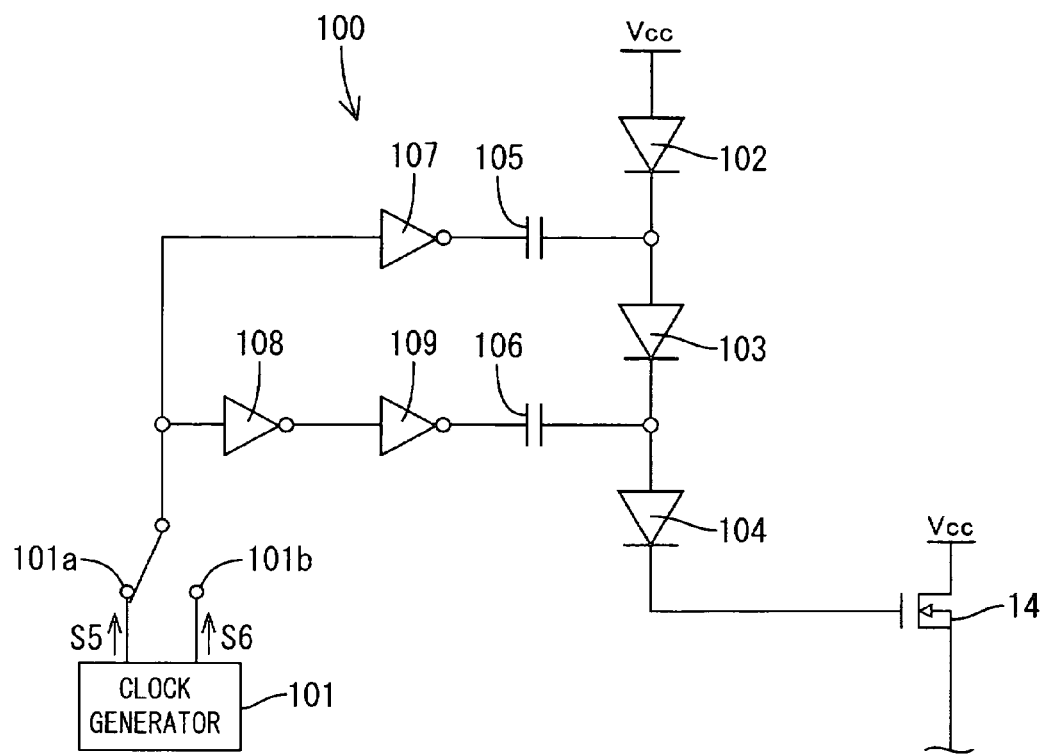
[FIG. 6] is a schematic diagram showing the construction of a charging circuit according to another embodiment.

FIG. 6 shows another embodiment. The present embodiment has difference from the above embodiment shown in FIGS. 1 to 5 in the construction of a charging circuit. The other portions are similar to the above embodiment shown in FIGS. 1 to 5, and therefore designated by the same symbols as the above embodiment shown in FIGS. 1 to 5. Redundant explanations are omitted, and the following explanation will be concentrated on the difference.

FIG. 6 shows the construction of the charging circuit of the present embodiment. The charging circuit mainly includes a charge pump 100 and a clock generator 101. The charge pump 100 includes three diodes 102-104 serially connected between the power supply terminal P2 and the gate of the power MOSFET 14, and further includes a pair of charge-pump capacitors 105, 106. One end side of the charge-pump capacitor 105 is connected to the connecting point between the diode 102 and the diode 103, while the other end side thereof is connected to the clock generator 101 via a buffer circuit (a NAND circuit) 107. One end side of the charge-pump capacitor 106 is connected to the connecting point between the diode 103 and the diode 104, while the other end side thereof is connected to the clock generator 101 via two buffer circuits (NAND circuits) 108, 109. According to this construction, charging operation is performed alternately for the two charge-pump capacitors 105, 106 in synchronization with a clock signal outputted from the clock generator 101, so that the gate voltage of the power MOSFET 14 is raised.

The clock generator 101 can generate two clock signals S5, S6 having different frequencies from each other (e.g. the frequency of the clock signal S6 is higher than the frequency of the clock signal S5), and includes a pair of output terminals 101a, 101b for outputting the respective clock signals 5, S6. During a normal charging operation described above, the output terminal 101a of the clock generator 101 is connected to the inputs of the buffer circuits 107, 108, so that a charge-pump operation or a charging operation is performed at a rate corresponding to the frequency of the clock signal S5. In contrast, during a rapid charging operation described above, the output terminal 101b of the clock generator 101 is connected to the inputs of the buffer circuits 107, 108, so that a charge-pump operation or a charging operation is performed at a higher rate corresponding to the frequency of the clock signal S6.

According to this construction, the charge rate of the charging circuit can be changed by switching the frequency of the clock signal applied to the charge pump 100. Thus switching of the charge rate can be achieved by a relatively simple construction.

Another Embodiment

Figure 7:
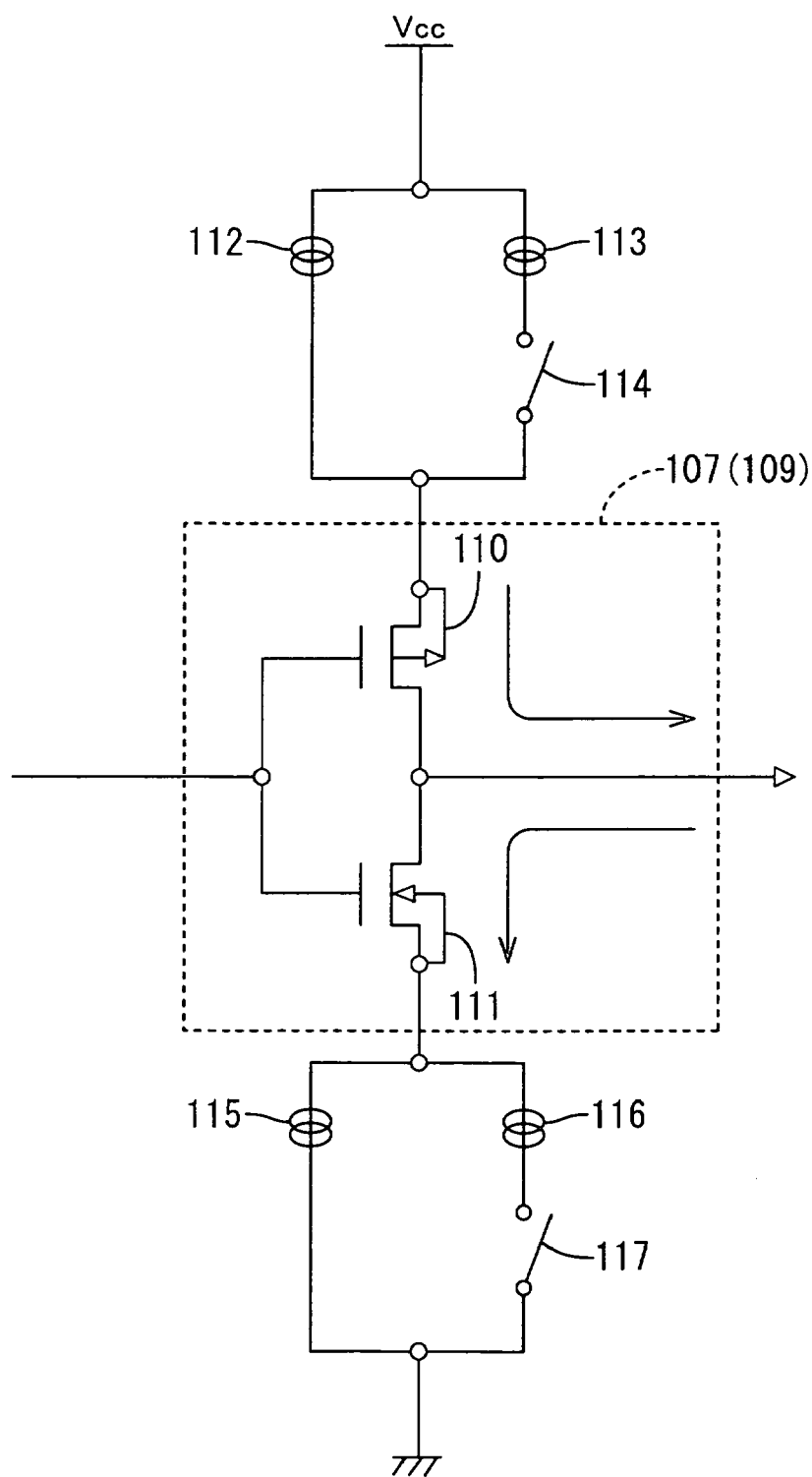
[FIG. 7] is a schematic diagram showing the construction of a charging circuit according to another embodiment.

FIG. 7 shows another embodiment. In the present embodiment, the construction of the above embodiment shown in FIG. 6 is modified so that a clock signal of a single frequency can be applied from the clock generator 101 to the charge pump 100. Further the constructions of the buffer circuits 107, 109 are modified.

Each of the buffer circuits 107, 109 includes a P-channel FET 110 and an N-channel FET 111 as shown in FIG. 7. The drains thereof are connected in common to each other, and the gates thereof are connected in common to each other. In the present embodiment, the source of the P-channel FET 110 is connected to the power supply terminal P2 via a constant current circuit 112, and also connected to the power supply terminal P2 via a constant current circuit 113 and a switching element 114. The source of the N-channel FET 111 is connected to the ground terminal P6 via a constant current circuit 115, and also connected to the ground terminal P6 via a constant current circuit 116 and a switching element 117.

In this construction, during a normal charging operation described above, the switching elements 114, 117 are turned off so that a charging operation for the gate of the power MOSFET 14 is performed at a rate corresponding to the constant current amounts of the constant current circuits 112, 115. In contrast, during a rapid charging operation described above, the switching elements 114, 117 are turned on, so that the constant currents of the constant current circuits 113, 116 are additionally applied for charging or discharging the charge-pump capacitors 105, 106 (i.e., the constant current amounts are added to the inflowing current from the buffer circuit 107 to the charge-pump capacitor 105 or added to the outflowing current from the charge-pump capacitor 106 to the buffer circuit 109). This results in reduction of the delay times in the buffer circuits 107, 109, and thereby the charging operation can be performed at a higher rate.

Another Embodiment

Figure 8:
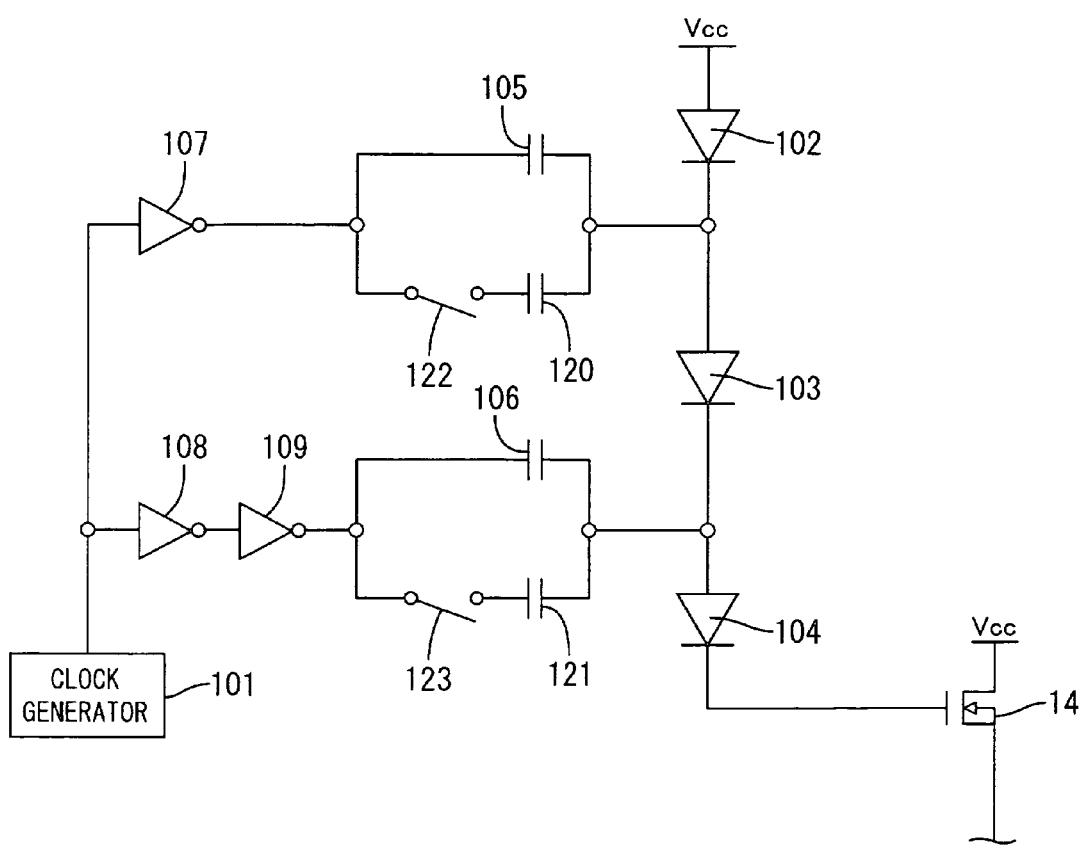
[FIG. 8] is a schematic diagram showing the construction of a charging circuit according to another embodiment.

FIG. 8 shows another embodiment. In the present embodiment, the construction of the above embodiment shown in FIG. 6 is modified so that a clock signal of a single frequency can be applied from the clock generator 101 to the charge pump 100. Further urgent charge-pump capacitors 120, 121 and switching elements 122 123 (i.e., an example of "a capacitance changing circuit") are connected in parallel to the respective charge-pump capacitors 105, 106.

In this construction, during a normal charging operation described above, the switching elements 122, 123 are turned off, so that a charging operation for the gate of the power MOSFET 14 is performed at a rate corresponding to the capacitances of the charge-pump capacitors 105, 106. In contrast, during a rapid charging operation described above, the switching elements 122, 123 are turned on, so that a charging operation is performed at a higher rate corresponding to the combined capacitances of the charge-pump capacitors 105, 106 and the urgent charge-pump capacitors 120, 121.

Another Embodiment

Figure 9:
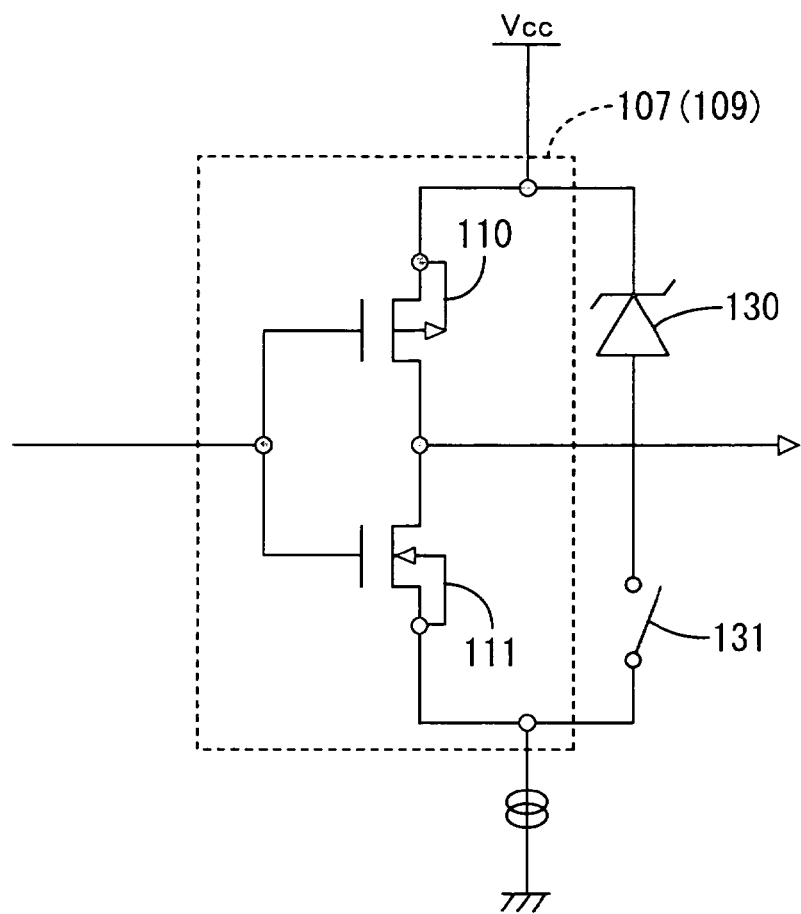
[FIG. 9] is a schematic diagram showing the construction of a charging circuit according to another embodiment.

FIG. 9 shows another embodiment. In the present embodiment, the construction of the above embodiment shown in FIG. 6 is modified so that a clock signal of a single frequency can be applied from the clock generator 101 to the charge pump 100. Further the constructions of the buffer circuits 107, 109 are modified.

In each of the buffer circuits 107, 109, a Zener Diode 130 and a switching element 131 are serially connected between the sources of a P-channel FET 110 and an N-channel FET 111 as shown in FIG. 9. During a normal charging operation described above, the switching element 131 is turned on so that the charging voltages of the charge-pump capacitors 105, 106 are limited to the Zener voltage of the Zener diode 130. Thereby a charging operation for the gate of the power MOSFET 14 is performed at a rate corresponding to the limited charging voltage. In contrast, during a rapid charging operation described above, the switching element 131 is turned off, and thereby the charge-pump capacitors 105, 106 can be charged so that the charging voltages thereof exceed the Zener voltage. Then a charging operation is performed at a higher rate corresponding to the charging voltage higher than the Zener voltage.

Other Embodiments

The present invention is not limited to the embodiments explained in the above description made with reference to the drawings. The following embodiments may be included in the technical scope of the present invention, for example.

(1) In the above embodiments, the power supply controller 10 includes the N-channel MOSFET as a MOSFET. However, the present invention is not limited to this construction, but a P-channel MOSFET may be included. In this case, the above circuits for discharge are disposed between the gates of the P-channel MOSFETs and the power source 12, while the circuits for charge are disposed between the gates and sources thereof.

(2) In the above embodiment shown in FIGS. 1 to 5, the normal discharge FET 91 is solely turned on during a normal state, while both of the normal discharge FET 91 and the urgent discharge FET 94 are turned on during a load anomaly. However, the present invention is not limited to this construction. For example, a discharge FET, which can provide discharge performance higher than that of the normal discharge FET 91, may be used as an urgent discharge FET 94, and the urgent discharge FET 94 may be solely turned on during a load anomaly.

(3) In the above embodiment shown in FIG. 6, two clock signals S5, S6 of different frequencies from the clock generator 101 are selectively applied to the charge pump 100. However, the present invention is not limited to this construction. For example, one output terminal connectable to the charge pump 100 may be provided, and the clock generator 101 may switch the frequency of the clock signal outputted from the output terminal.

(4) In the above embodiment shown in FIG. 7, variable resistors as a current changing circuit may be provided between the power supply terminal P2 and the source of the P-channel FET 110, and between the source of the N-channel FET 111 and the ground terminal P6, respectively.

(5) In the above embodiment shown in FIG. 8, variable capacitors may be used as charge-pump capacitors, and the charge rate can be changed by varying the capacitance.

The invention claimed is:

1. A power supply controller comprising:
a MOSFET disposed between a power source and a load;
a current detecting element configured to output a current detection signal corresponding to a load current passing through said MOSFET;
an overcurrent protective circuit configured to perform a forcing shutoff operation for said MOSFET, if a first current anomaly, in which a load current passing through said MOSFET exceeds a first threshold, is determined based on said current detection signal;
a charging circuit configured to turn on said MOSFET based on an external ON signal by applying a charging current to a gate of said MOSFET, said charging circuit being capable of changing a charge rate thereof; and
a control circuit configured to increase the charge rate of said charging circuit if a second current anomaly, in which a load current passing through said MOSFET exceeds a second threshold lower than said first threshold, is determined based on said current detection signal, so that the charge rate is higher than that when said load current is equal to or lower than said second threshold.

2. A power supply controller as in claim 1, wherein said MOSFET is an N-channel type.

3. A power supply controller as in claim 1, wherein:
said charging circuit includes a charge-pump portion, and a clock generator capable of applying a clock signal of different frequencies to said charge-pump portion so as to cause said charge-pump portion to perform a charge-pump operation according to a frequency of the applied clock signal; and
said control circuit is configured to change the charge rate of said charging circuit by causing change of the frequency of said clock signal to be applied to said charge-pump portion.

4. A power supply controller as in claim 1, wherein:
said charging circuit includes a charge-pump capacitor, a buffer circuit connected to one end side of said charge-pump capacitor for charging or discharging said charge-pump capacitor, and a current changing circuit for changing a current amount for said charge or discharge performed by said buffer circuit; and
said control circuit is configured to change the charge rate of said charging circuit by causing change of the current amount for said charge or discharge.

5. A power supply controller as in claim 1, wherein:
said charging circuit includes a charge-pump capacitor, a buffer circuit connected to one end side of said charge-pump capacitor for charging or discharging said charge-pump capacitor, and a capacitance changing circuit for changing capacitance of said charge-pump capacitor; and
said control circuit is configured to change the charge rage of said charging circuit by causing change of the capacitance of said charge-pump capacitor.

6. A power supply controller as in claim 1, wherein:
said charging circuit includes a charge-pump capacitor, a buffer circuit connected to one end side of said charge-pump capacitor for charging or discharging said charge-pump capacitor, and a charging-voltage changing circuit for changing a charging voltage for charging of said charge-pump capacitor performed by said buffer circuit; and said control circuit is configured to change the charge rate of said charging circuit by causing change of said charging voltage.

7. A power supply controller as in claim 1, wherein:
said charging circuit includes a first charger having a charge-pump capacitor and being disposed between said power source and the gate of said MOSFET for performing a charge-pump operation, and further includes a second charger having a charge switching element disposed between said power source and the gate of said MOSFET, said second charger being configured to form a charge path for said gate by turning on said charge switching element; and
said control circuit is configured to change the charge rate of said charging circuit by switching said charge switching element between on and off.

8. A power supply controller as in claim 1, further comprising a discharging circuit configured to turn off said MOSFET by releasing a gate charge of said MOSFET, said discharging circuit being capable of changing a discharge rate thereof;
wherein said control circuit is configured to increase the discharge rate of said discharging circuit when a shutoff operation is performed during said load current exceeding said second threshold, so that the discharge rate is higher than that for a shutoff operation being performed during said load current being equal to or lower than said second threshold.

9. A power supply controller as in claim 8, wherein:
said discharging circuit includes a plurality of discharge switching elements being connected in parallel and being disposed between the gate and source of said MOSFET; and
said control circuit is configured to change the discharge rate of said discharging circuit by changing combination of discharge switching element(s) being selected from said plurality of discharge switching elements and being turned on.

* * * * *